United States Patent
Vashchenko et al.

(10) Patent No.: US 7,057,215 B1
(45) Date of Patent: Jun. 6, 2006

(54) PMOS BASED LVTSCR AND IGBT-LIKE STRUCTURE

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 2 days.

(21) Appl. No.: 10/210,948

(22) Filed: Aug. 2, 2002

(51) Int. Cl.
*H01L 29/74* (2006.01)
*H01L 31/111* (2006.01)

(52) U.S. Cl. .................... 257/173; 257/133

(58) Field of Classification Search ............... 257/110, 257/107, 139, 141, 133, 173, 174, 143, 144, 257/145, 355, 360, 363, 364, 162; 438/296, 438/133, 221
See application file for complete search history.

(56) References Cited

U.S. PATENT DOCUMENTS

| | | | |
|---|---|---|---|
| 6,255,704 B1 * | 7/2001 | Iwata et al. | 257/401 |
| 6,531,741 B1 * | 3/2003 | Hargrove et al. | 257/350 |
| 2002/0163009 A1 * | 11/2002 | Ker et al. | 257/107 |

* cited by examiner

*Primary Examiner*—B. William Baumeister
*Assistant Examiner*—Dana Farahani
(74) *Attorney, Agent, or Firm*—Turgen Vollrath

(57) ABSTRACT

In an ESD protection device making use of a LVTSCR-like structure or an IGBT-like structure, negative polarity overvoltage protection is achieved by providing a LVTSCR-like structure or IGBT-like structure that defines a PMOS device.

5 Claims, 3 Drawing Sheets

US 7,057,215 B1

PMOS BASED LVTSCR AND IGBT-LIKE STRUCTURE

FIELD OF THE INVENTION

The invention relates to ESD protection structures and implementations of the structures. More particularly, it relates to LVTSCR-like devices and IGBT-like devices for self-protection of I/O cells and for use as local clamps.

BACKGROUND OF THE INVENTION

Analog circuits typically display sensitivity to excessive voltage levels. Transients, such as electrostatic discharges (ESD) can cause the voltage handling capabilities of the analog circuit to be exceeded, resulting in damage to the analog circuit. Clamps have been devised to shunt current to ground during excessive voltage peaks.

Some protection clamps employ avalanche diodes such as zener diodes to provide the bias voltage for the base of a subsequent power bipolar junction transistor (BJT).

As one alternative, grounded gate NMOS devices (GGNMOS) have also been used as ESD protection devices. However, GGNMOS devices are not only large, consuming a lot of space on a chip, they also suffer from the disadvantage that they support only limited current densities. The protection capability of an ESD protection device can be defined as the required contact width of the structure required to protect against an ESD pulse amplitude, or, stated another way, as the maximum protected ESD pulse amplitude for a given contact width. Thus, the smaller the contact width for a given ESD pulse amplitude protection, the better.

Silicon-controlled rectifiers (SCR), for instance, provide excellent protection against high current densities during ESD events. One of the advantages of SCR 100 over other ESD protection devices, such as a grounded-gate MOS transistor, is the double injection of carriers, which provides current densities (after snapback) that are about ten times greater than the densities provided by a grounded-gate MOS device.

One of the disadvantages of a SCR, however, is that a very large positive voltage, e.g., 50 volts, must be dropped across its nodes before the junction breaks down. As a result, SCRs can not be used to protect devices, such as MOS transistors, that can be permanently damaged by much lower voltages, e.g., 15 volts.

One solution proposed in the past, was to use low voltage silicon controlled rectifiers (LVTSCRs) which are not only smaller but allow the reaching of current densities, after snap back, that are some ten times higher than the current densities of traditionally used grounded gate NMOS devices (GGNMOS), thus increasing the ESD protection capability for CMOS circuits.

However conventional LVTSCRs fail to address yet another concern in designing ESD protection devices, namely the ability to accommodate both positive and negative polarity voltage pulses. Nevertheless a brief overview of the structure and workings of a LVTSCR is useful.

A conventional LVTSCR incorporates a NMOS transistor into the SCR structure. FIG. 1 shows a cross-sectional diagram of a conventional LVTSCR 100. It includes a gate 110 that is formed over channel region 112 and is isolated by a gate oxide layer 114. The channel region 112 is flanked by two n+ regions 116, 118, to define a NMOS transistor.

In operation, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10–15 volts.

Typically the NMOS transistor is formed to be identical to the to-be-protected MOS transistors. Thus, the junction between n+ region 116 and p-material 120 breaks down at the same time that the to-be-protected MOS transistors experience junction break down as a result of an ESD pulse.

In operation, when the voltage across node 124 (which is connected to the high potential) and node 126 (which is connected to the low potential) is positive and less than the trigger voltage, the voltage reverse biases the junction between n-well 122 and p-type material 120. The reverse-biased junction, in turn, blocks charge carriers from flowing from node 124 to node 126. However, when the voltage across nodes 124 and 126 is positive and equal to or greater than the trigger voltage, the reverse-biased junction breaks down due to avalanche multiplication.

The breakdown of the junction causes a large number of holes to be injected into material 120, and a large number of electrons to be injected into n-well 122. The increased number of holes increases the potential of material 120 in the region that lies adjacent to n+ region 118, and eventually forward biases the junction between material 120 and n+ region 118.

When the increased potential forward biases the junction, a npn transistor defined by the n+ region 118, p-type material 120 and n-well 122 turns on. When turned on, n+ (emitter) region 118 injects electrons into (base) material 120. Most of the injected electrons diffuse through (base) material 120 and are swept from (base) material 120 into (collector) n-well 122 by the electric field that extends across the reverse-biased junction. The electrons in (collector) n-well 122 are then collected by n+ region 130.

A small number of the electrons injected into (base) material 120 recombine with holes in (base) material 120 and are lost. The holes lost to recombination with the injected electrons are replaced by holes injected into (base) material 120 by the broken-down reverse-biased junction and, as described below, by the collector current of a pnp transistor, thereby providing the base current.

The electrons that are injected and swept into n-well 122 also decrease the potential of n-well 122 in the region that lies adjacent to p+ region 132, and eventually forward bias the junction between p+ region 132 and n-well 122. When the decreased potential forward biases the junction between p+ region 132 and n-well 122, a pnp transistor formed from p+ region 132, n-well 122, and material 120, turns on.

When turned on, p+ emitter 132 injects holes into base 122. Most of the injected holes diffuse through (base) n-well 122 and are swept into (collector) material 120 by the electric field that extends across the reverse-biased junction. The holes in (collector) material 120 are then collected by p+ region 134.

A small number of the holes injected into (base) n-well 122 recombine with electrons in (base) n-well 122 and are lost. The electrons lost to recombination with the injected holes are replaced by electrons flowing into n-well 122 as a result of the broken-down reverse-biased junction. Thus, a small part of the npn collector current forms the base current of the pnp transistor.

Similarly, the holes swept into (collector) material 120 also provide the base current holes necessary to compensate for the holes lost to recombination with the diffusing electrons injected by n+ (emitter) region 118. Thus, a small part of the pnp collector current forms the base current of the npn transistor.

Thus, n+ region 118 injects electrons that provide both the electrons for the collector current of the npn transistor as well as the electrons for the base current of the pnp transistor. At the same time, p+ region 132 injects holes that provide both the holes for the collector current of the pnp transistor as well as the holes for the base current of the npn transistor.

Since junction break down occurs before the MOS transistors of the protected circuit experience destructive gate oxide break down, LVTSCR 100 turns on before destructive gate oxide breakdown occurs, thereby protecting the MOS transistors.

However, as mentioned above, one disadvantage of LVTSCR 100 is that it operates only for positive polarity pulses. Ideally a protection device must not only be able to handle the high current densities encountered during an ESD pulse, it must also, in the case of I/O cell protection, accommodate both positive and negative polarity voltage pulses.

The present invention seeks to address this issue.

SUMMARY OF THE INVENTION

The present invention provides a PMOS based LVTSCR-like structure. Accordingly it provides a LVTSCR-like structure that incorporates a PMOS device defined by a gate with a n-channel region, and a pair of p+ regions flanking the n-channel region. It may therefore be considered as a PMOS based IGBT.

The invention further provides an Insulated Gate Bipolar Transistor-like structure (IGBT-like structure) that defines a PMOS device. It may therefore be considered as a PMOS based IGBT.

The invention, further provides for a new LVTSCR-like ESD protection structure and an IGBT-like ESD protection structure that protect against negative voltage pulses.

The invention further provides for a self-protecting I/O circuit that makes use of LVTSCR-like structures or IGBT-like structures to provide both positive and negative over-voltage protection.

Thus, according to the invention, there is provided a LVTSCR-like structure that defines a PMOS transistor. The PMOS transistor includes a gate formed over a n-doped channel region, with a p-doped region on either side of the channel region.

Further, according to the invention there is provided a IGBT-like structure that defines a PMOS transistor. The PMOS transistor includes a gate formed over a n-doped channel region, with a p-doped region on either side of the channel region.

Still further, according to the invention, there is provided a method of protecting against negative voltage pulses using a LVTSCR-like structure or an IGBT-like structure, comprising reversing the doping polarities to define a PMOS structure in the LVTSCR-like structure or IGBT-like structure, instead of a NMOS structure.

Still further, according to the invention, there is provided a self-protecting I/O circuit comprising a conventional LVTSCR that defines a NMOS structure, wherein the cathode of the LVTSCR is connected to VSS, and a LVTSCR-like structure that defines a PMOS structure, wherein the anode of the LVTSCR-like structure is connected to VDD and its cathode is connected to the anode of the conventional LVTSCR.

Still further, according to the invention, there is provided a self-protecting I/O circuit comprising a conventional IGBT that defines a NMOS structure, wherein the cathode of the IGBT is connected to VSS, and an IGBT-like structure that defines a PMOS structure, wherein the anode of the IGBT-like structure is connected to VDD and its cathode is connected to the anode of the conventional IGBT.

DETAILED DESCRIPTION OF THE INVENTION

Figure 2:
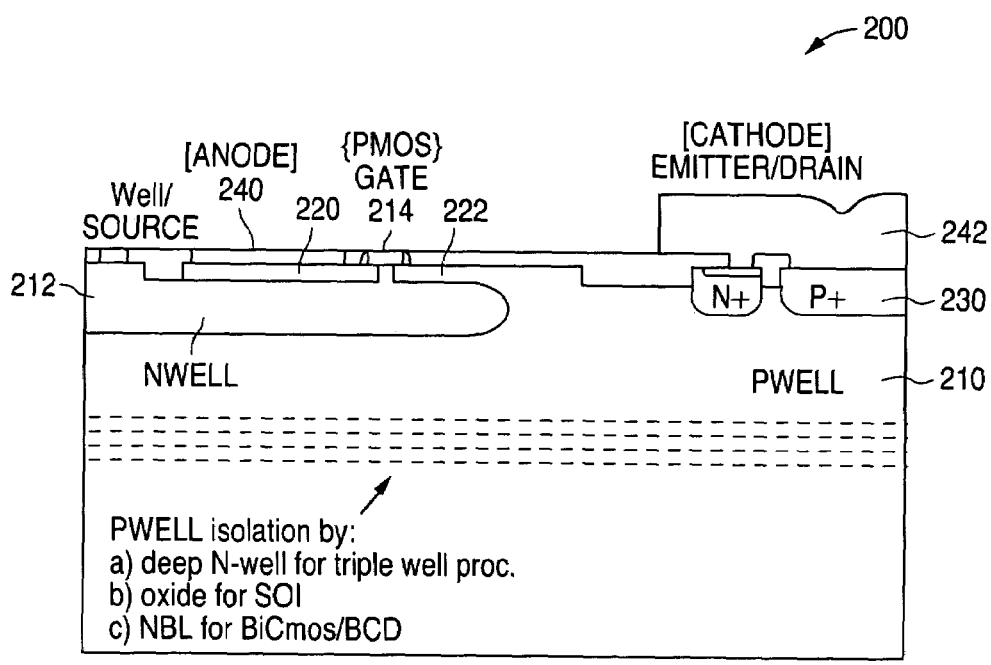
FIG. 2 is a cross-sectional view of one embodiment of a LVTSCR-like structure of the invention.

One embodiment of a LVTSCR-like structure of the invention is illustrated in FIG. 2. The structure 200 includes a p-well 210 in which is formed a n-well 212. A gate 214 is formed on the structure above a channel region 216. Two p-type regions 220, 222 flank the n-channel region 216 to define a PMOS structure. Since the p-type region 222 extends into the p-well 210 and ultimately into a p+ region 230, regions 210 and 230 can be thought of as part of the drain of the PMOS device. The p-type region 220, in turn forms the source of the PMOS device. The contact 240 to the source also constitutes the anode contact of the LVTSCR-like structure 200. The drain contact 242, in turn, also constitutes the cathode contact of the structure 200.

The PMOS based LVTSCR-like structure of the invention is adaptable to a variety of processes. Insofar as the structure is used for an inverter circuit, the p-well 210 of the structure should be isolated. In the case of BiCMOS or BCD (DMOS) technology, the isolation is achieved using a n-buried layer (NBL). In the case of Silicon Over Insulator (SOI), the device is automatically isolated by the SOI oxide. In the case of CMOS triple well process, which contains a deep n-well, this deep n-well serves to isolate the p-well 210.

Figure 3:
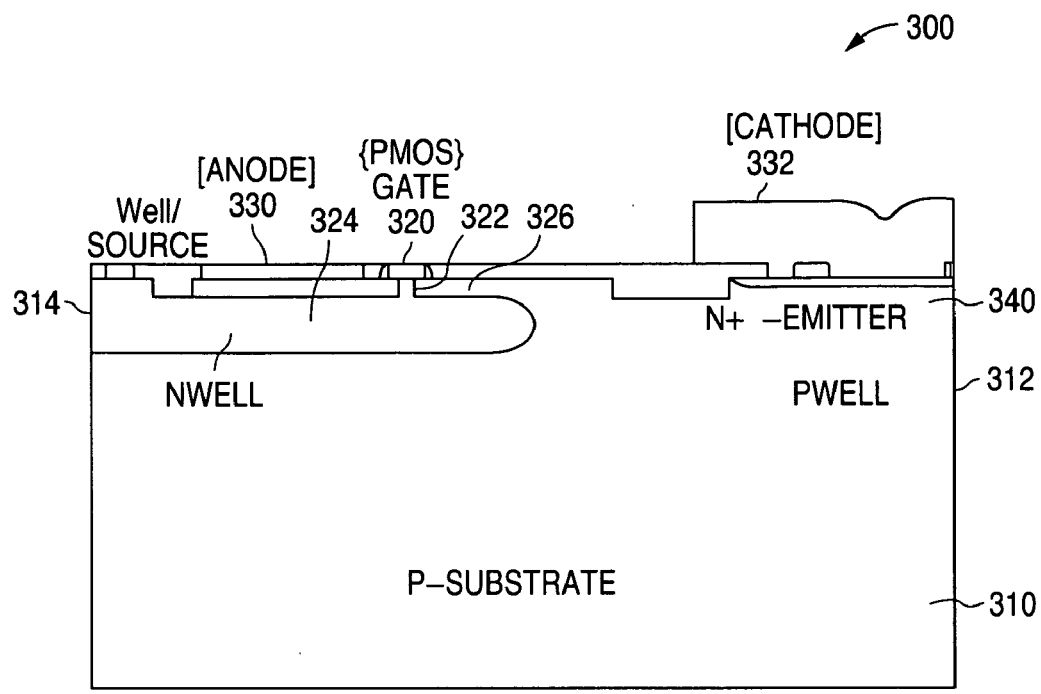
FIG. 3 is a cross-sectional view of one embodiment of a IGBT-like structure of the invention.

The present invention also contemplates implementation in the form of an IGBT-like structure, which, like the LVTSCR-like structure has implantations of reversed polarity to define a PMOS device, as shown in FIG. 3. The IGBT of the invention thus provides a high speed, negative polarity protection solution. The IGBT-like structure 300 comprises a p-substrate 310 which includes a p-well 312 and a n-well 314. A gate 320 is formed over a n-channel 322, which is flanked by p− regions 324 and 326. The p− region 324 defines the source of a PMOS transistor, while the p− region 326 extends into the p-well 312. The p-region 326 together with the p-well 312 defines the drain of the PMOS transistor. The structure, further, includes a n+ emitter region 340. The drain contact 330 serves as the anode contact for the device 300 while the emitter contact 332 serves as the cathode contact for the device 300. As in the case of a LVTSCR, the IGBT is a double injection device having a n+ region 340 forming the emitter of a npn transistor for injecting electrons into the p-well 312.

TCAD simulations of the operation of the LVTSCR-like and IGBT-like structures of the invention confirm the capabilities of the structures in providing protection against negative polarity ESD pulses. In particular, the results confirm the viability of the structures to provide proper 2 kV ESD protection with contact widths of less than 50 µm. This is comparable to positive pulse capabilities of conventional LVTSCR structures and far exceeds the reverse voltage capabilities of other prior art structures with contact widths as large as 300–500 µm.

Figure 1:
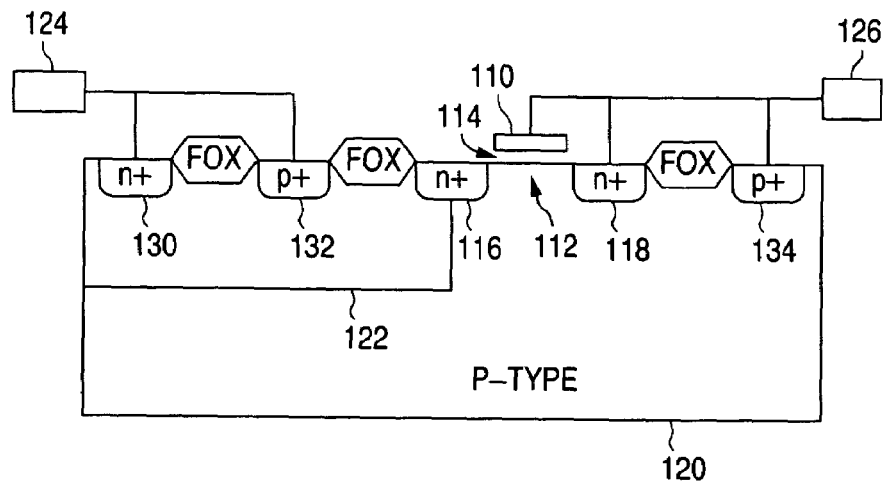
FIG. 1 is a cross-sectional view of a conventional prior art LVTSCR.
Figure 4:
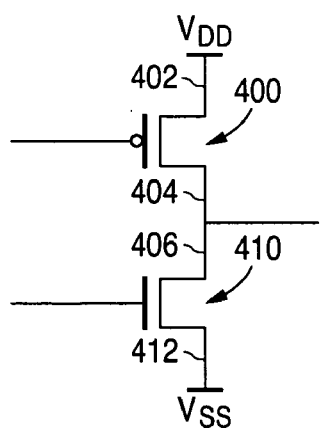
FIG. 4 is a schematic circuit diagram of a simple I/O circuit.

The present invention thus avoids the need to provide a separate diode structure in order to protect the conventional LVTSCR against negative pulses. (Conventional NMOS-based LVTSCRs like the one in FIG. 1, define a rather weak body diode between the n+ region 130 and the p+ region of the adjacent structure, and between the p+ region 134 and the n+ region of the adjacent structure, thus, typically requiring a separate diode structure to protect against negative voltage pulses.) By providing a complementary structure to the conventional LVTSCR and the conventional IGBT, the present invention allows self protecting circuits such as the I/O circuit of FIG. 4 to be implemented. FIG. 4 shows a PMOS-based device 400 (either a LVTSCR-like structure or IGBT-like structure of the invention) with its anode 402 connected to VDD and its cathode 404 connected to the anode 406 of a conventional NMOS-based device 410. The conventional device thus forms a complementary device to the device 400 and has its cathode 412 connected to VSS. (Thus the device 410 will take the form of a conventional LVTSCR or conventional IGBT, respectively).

Figure 5:
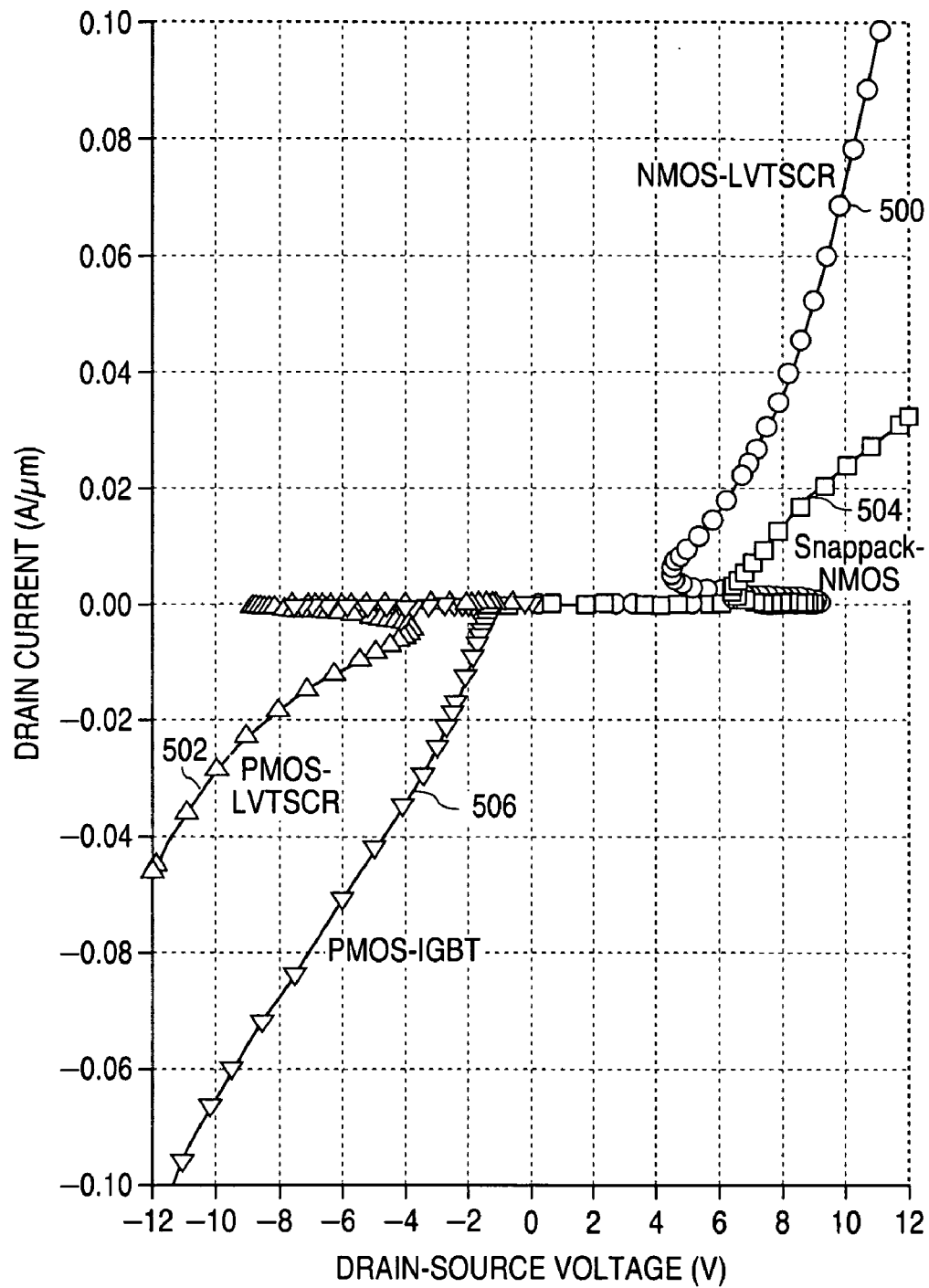
FIG. 5 are I-V curves for positive and negative voltage pulses on an I/O circuit as in FIG. 4, showing the effect of both the use of LVTSCR structures and IGBT structures.

The effect of a positive pulse on a conventional NMOS-based LVTSCR (curve 500) is contrasted in the I-V curves of FIG. 5 with the effect of a negative pulse on a PMOS-based LVTSCR structure of the invention (curve 502). FIG. 5 also shows a positive pulse curve for a conventional snapback NMOS device (curve 504) and a negative pulse curve for an IGBT-like device of the invention (curve 506).

While the present invention has been described with respect to specific embodiments, it will be appreciated that variations on the structures can be implemented without departing from the claimed invention, and that the structures of the invention can find application in a wide variety of circuits requiring negative polarity over-voltage protection.

What is claimed is:

1. A semiconductor structure comprising,
   an n-well formed in a p-well,
   a n+ region formed in the p-well, which defines a cathode of the structure,
   a PMOS transistor comprising a first p-type region formed in the n-well and a second p-type region formed partly in the n-well and partly in the p-well, the first and second p-type regions defining an n-doped channel region between them and the first p-type region defining an anode of the structure, and
   a p-well isolation layer formed under the p-well.

2. The structure of claim 1, wherein the PMOS transistor includes a gate formed over the n-doped channel region.

3. A structure of claim 1, wherein the isolation layer is an n-buried layer in the case of BiCMOS or BCE technology, or is a Silicon Over Insulator (SOI) layer in the case of a SOI process, or is a deep n-well in the case of a CMOS triple well process.

4. A method of protecting against negative voltage pulses using a snapback structure, comprising
   forming an n-well in a p-well,
   forming a PMOS structure comprising two p-type regions so that the one p-type region is formed in the n-well and defines an anode of the structure,
   forming an n+ region in the p-well, and
   providing a horizontally extending p-well isolation layer under the p-well.

5. A self-protecting I/O circuit comprising
   a conventional LVTSCR that defines a NMOS structure, wherein the cathode of the LVTSCR is connected to VSS, and
   a second structure that includes
      an n-well formed in a p-well,
      a n+ region formed in the p-well, which defines a cathode of the second structure,
      a PMOS transistor comprising a first p-type region formed in the n-well and a second p-type region formed partly in the n-well and partly in the p-well, the first and second p-type regions defining an n-doped channel region between them and the first p-type region defining an anode of the second structure, and
      a p-well isolation layer formed under the p-well, wherein the anode of the second structure is connected to VDD and its cathode is connected to the anode of the conventional LVTSCR.

* * * * *